United States Patent
Jo

(10) Patent No.: US 7,279,382 B2
(45) Date of Patent: Oct. 9, 2007

(54) METHODS OF MANUFACTURING SEMICONDUCTOR DEVICES HAVING CAPACITORS

(75) Inventor: Bo Yeoun Jo, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/750,246

(22) Filed: Dec. 31, 2003

(65) Prior Publication Data

US 2005/0048786 A1    Mar. 3, 2005

(30) Foreign Application Priority Data

Sep. 1, 2003    (KR) .................. 10-2003-0060924

(51) Int. Cl.
*H01L 21/8242*    (2006.01)
(52) U.S. Cl. ..................... 438/254; 438/957
(58) Field of Classification Search ............... 438/253, 438/254, 396, 397, 957, 963
See application file for complete search history.

(56) References Cited

U.S. PATENT DOCUMENTS

| 6,599,829 | B2* | 7/2003 | Smith et al. ................. 438/636 |
| 6,794,298 | B2* | 9/2004 | Shields et al. .............. 438/710 |
| 2001/0044214 | A1* | 11/2001 | Izawa ......................... 438/712 |
| 2003/0114010 | A1* | 6/2003 | Jung ........................... 438/707 |

* cited by examiner

*Primary Examiner*—Chandra Chaudhari
(74) *Attorney, Agent, or Firm*—Andrew D. Fortney

(57) ABSTRACT

An example method of manufacturing a semiconductor device having a capacitor includes sequentially depositing a lower metal layer, an insulating layer and an upper metal layer on a semiconductor substrate, removing a first photoresist pattern by using $O_2/N_2$ plasma, and removing polymer existing on the lower metal layer by using $H_2O/CF_4$ plasma. According to one example, the capacitor may include a lower electrode film, the capacitor insulating film and the upper electrode film.

21 Claims, 3 Drawing Sheets

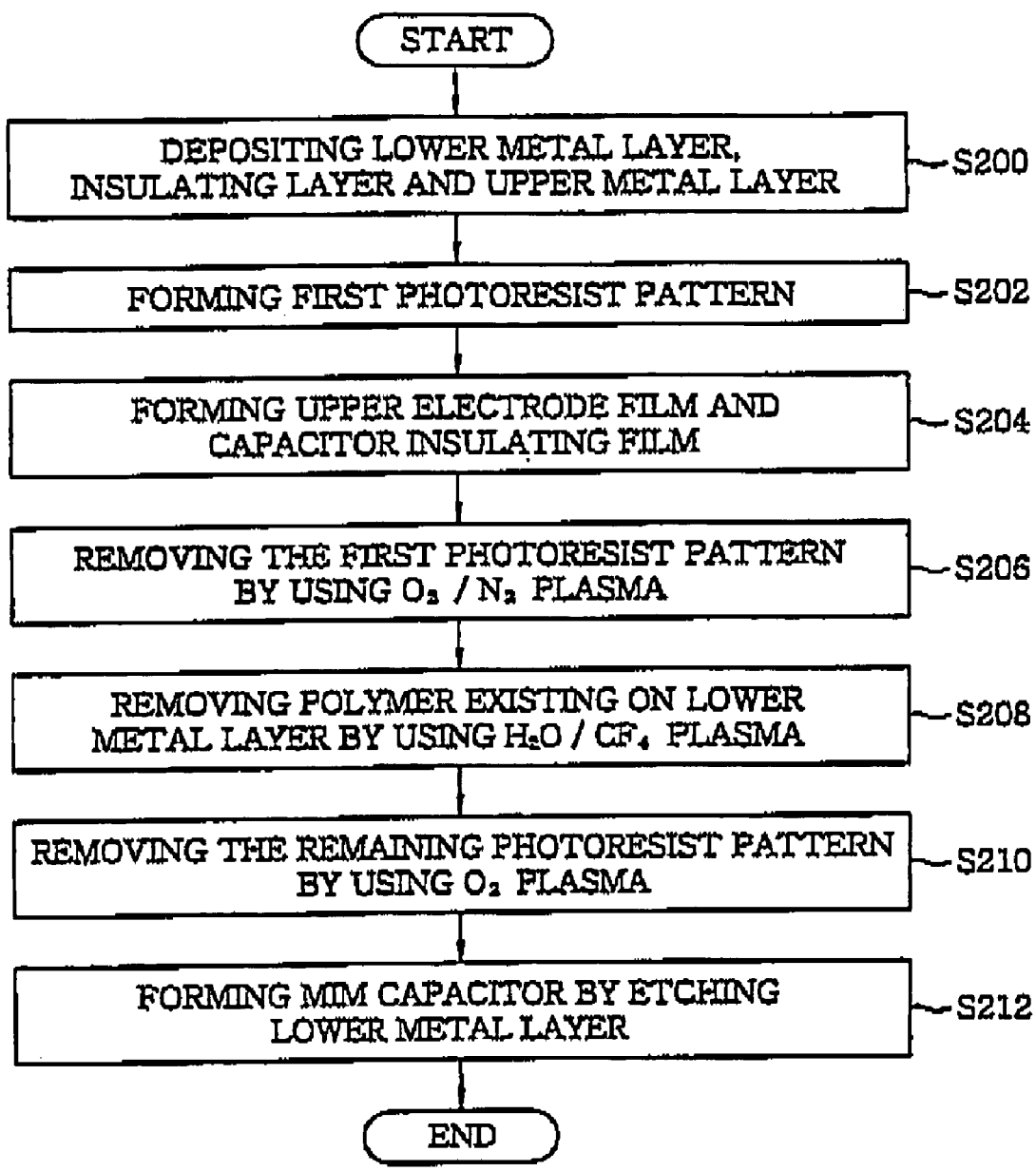

METHODS OF MANUFACTURING SEMICONDUCTOR DEVICES HAVING CAPACITORS

TECHNICAL FIELD

The present disclosure relates to semiconductor devices and, more particularly, to methods of manufacturing semiconductor device having capacitors.

BACKGROUND

Recently, there has been a demand for a system large scale integrated circuit (LSI) that combines several LSIs into a single LSI. The demand has been driven by the desire for more compact and faster devices and products. Further, a hybrid LSI, combining an analog circuit and a digital circuit into a single LSI has been developed as communications technology progresses.

A capacitor having a highly precise and stable characteristics independent of voltage is required for the manufacture of analog circuits. Polysilicon insulator polysilicon (PIP) capacitors have been used in such applications. The PIP capacitor is composed of two impurity-doped electrodes and an ONO (oxide-nitride-oxide) film interposed therebetween.

The PIP capacitor has significant drawbacks in that PIP capacitor has large voltage and temperature coefficients, so that the capacitor suffers from a large voltage and temperature dependency. Further, the LSI may not be operated stably due to a large resistance of poly-Si.

As an alternative to solve such problems, therefore, the use of a metal insulator metal (MIM) capacitor has been proposed. The MIM capacitor, utilizing metal electrodes having a lower voltage coefficient and a lower electric resistance than poly-Si, can be formed in multiple wiring layers so that a parasitic capacitance can be also restrained. Particularly, such MIM capacitor is used in a high frequency semiconductor device. That is, a high-frequency device uses the MIM capacitor utilizing a metal of excellent electric characteristics because device characteristics thereof can be changed by RC delay.

FIGS. 1A, 1B, 1C and 1D are cross sectional views showing a structure of a known MIM capacitor and a known manufacturing process. As shown in FIG. 1A, a lower metal layer 102, an insulating layer 104 and an upper metal layer 106 are sequentially deposited on a semiconductor substrate 100. Subsequently, a first photoresist pattern 108 is formed on the upper metal layer 106. The lower metal layer 102 is typically formed by laminating an insulating film such as an oxide film, a Ti/TiN film serving as a first barrier metal film, a metal film made of aluminum or copper, and a Ti/TiN film serving as a second barrier metal film.

Next, an upper electrode film 106' and a capacitor insulating film 104' are formed by etching the upper metal layer 106 and the insulating layer 104, as shown in FIG. 1B, wherein the first photoresist pattern 108 and the lower metal layer 102 serve as a mask and an end point, respectively. Conventionally, etching of the upper metal layer 106 and the insulating layer 104 is done by metal RIE.

In a RIE process for etching the upper metal layer 106 and the insulating layer 104, polymer 110 is normally produced on the lower metal layer 102. Though a cleaning process is performed to remove the polymer 110 before performing next processes, the polymer 110 is not removed completely and a part thereof remains.

Next, as shown in FIG. 1C, the first photoresist pattern 108 is removed and then there is formed on the resultant structure a second photoresist pattern 112 for completely encapsulating the upper electrode film 106' and the capacitor insulating film 104' to pattern the lower metal layer 102.

Subsequently, as shown in FIG. 1D, a lower electrode film 102' is formed by etching the lower metal layer 102 by using the second photoresist pattern 112 as a mask, and then the second photoresist pattern 112 is removed. Therefore, a MIM capacitor 114 including the lower electrode film 102', the capacitor insulating film 104' and the upper electrode film 106' is obtained.

However, certain parts of the lower metal layer 102, e.g., an area shown in FIG. 1D at reference character A, may not be properly etched at the step of etching the lower metal layer 102 due to the polymer 110 remaining on the lower metal layer 102. Therefore, characteristics of the MIM capacitor are deteriorated and a production yield is also lowered.

BRIEF DESCRIPTION OF THE DRAWINGS

FIG. 2 is a flow chart illustrating an example disclosed manufacturing process of an MIM semiconductor device.

DETAILED DESCRIPTION

Figure 1A:
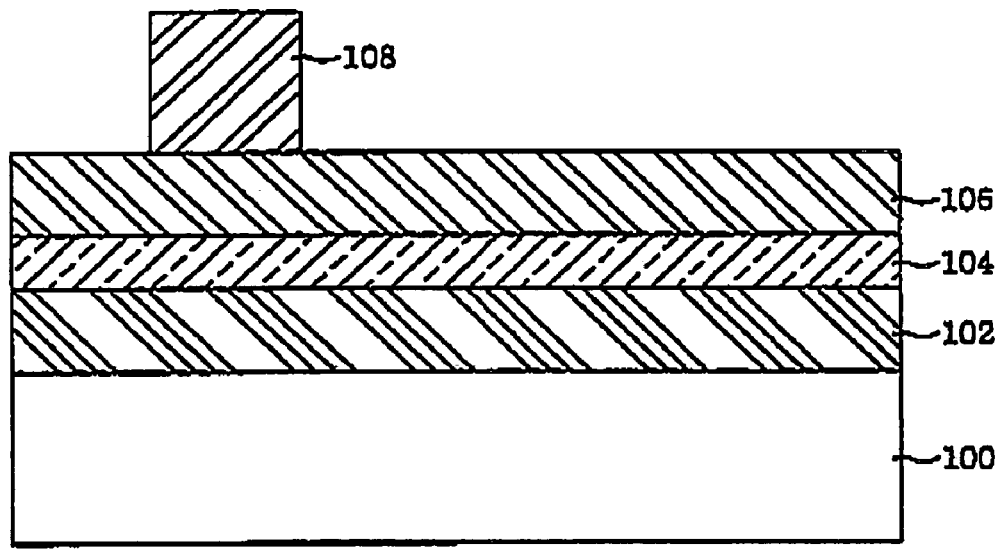
FIGS. 1A, 1B, 1C and 1D are cross sectional views showing a conventional manufacturing process of an MIM semiconductor device.
Figure 1B:
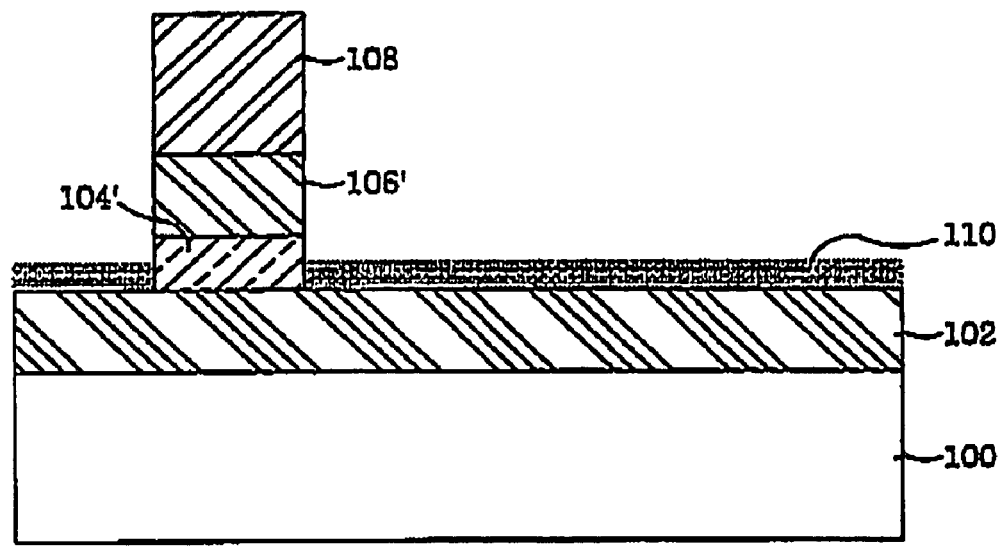

First, as disclosed herein, is an example method for efficiently removing polymer generated while manufacturing a conventional MIM capacitor. An example manufacturing process of an MIM capacitor is described by referring to FIGS. 1A to 1D.

FIG. 2 is a flow chart showing example manufacturing steps for an MIM capacitor. Referring to FIG. 2, a lower metal layer 102 is deposited on a semiconductor substrate 100 by sputtering, and then an insulating layer 104 and an upper metal layer 106 are sequentially deposited on the lower metal layer 102 (block S200). In this case, the deposited lower metal layer 102 may have a thickness of about 5000 Å and may, for example, include an insulating film such as an oxide film, a Ti/TiN film serving as a first barrier metal film, a metal film of aluminum or copper, and a Ti/TiN film serving as a second barrier metal film as in the prior art. The insulating layer 104 may have a thickness of about 600 Å is a nitride film such as PE(plasma enhanced)-SiN, and the upper metal layer 106 includes a Ti film having a thickness of about 500 Å and a TiN film having a thickness of about 1500 Å.

Next, a photoresist having a thickness of about 13000 Å is applied on the upper metal layer 106, and then is exposed and developed to produce the first photoresist pattern 108 (block S202). Subsequently, an upper electrode film 106' and a capacitor insulating film 104' are formed by etching the upper metal layer 106 and the insulating layer 104 by using the first photoresist pattern 108 as an etching mask (block S204). In this case, a metal RIE is used for the etching of the upper metal layer 106 and the insulating layer 104. Conditions of the metal RIE for the upper metal layer 106 are 8 mtorr/900 W (source)/150 W (bias)/50 $Cl_2$/10 $CHF_3$/50 Ar/10 sec (which means that a process pressure is about 8 mtorr; a source power is about 900 W; a bias power is about 150 W; a flow rate of $Cl_2$ is about 50 sccm; a flow rate of $CHF_3$ is about 10 sccm; a flow rate of Ar is about 50 sccm; and a process time is about 10 sec). Conditions of the metal RIE for the insulating layer 104 are 8 mtorr/900 W (source)/150 W (bias)/20 $CHF_3$/150 Ar/10 sec.

Next, an ashing process is performed to remove polymer 110 generated while etching the upper metal layer 106 and the insulating layer 104 by the above-described metal RIEs. The ashing process may include three phases on the whole.

At a first phase, the first photoresist pattern 108 is removed by using $O_2/N_2$ plasma, and the processing condition thereof is 2 torr/1400 W/3000 $O_2$/300 $N_2$/250° C. (block S206). A process time is determined by considering a thickness of the first photoresist pattern 108. In this case, a process time of the first step is set to be about 50 seconds because a thickness of the first photoresist pattern 108 is about 13000 Å.

At a second step, the polymer 110 is removed by using $H_2O/CF_4$ plasma, and the processing condition thereof is 2 torr/1400 W/750 $H_2O$/75 $CF_4$ /20 sec/250° C. (block S208). In this case, when using quartz in ashing equipment, a flow rate of a $CF_4$ gas is set to be in a range from 5% to 15% of that of a $H_2O$ gas in order to prevent the quartz from being eroded by F radicals of $CF_4$. In one example, a process time of the second phase is in a range from 30% to 50% of that of the first phase, e.g., 20 seconds.

In a third phase, possible residues of the first photoresist pattern 108 which can still persist even after being subjected to the first and the second phases are removed again by using $O_2$ plasma. In this case, a process time of the third step is set to be a in range from 40% to 60% of that of the first phase, and a processing condition thereof is 2 torr /1400 W/3000 $O_2$/25 sec/250° C. (block S210).

Figure 1C:
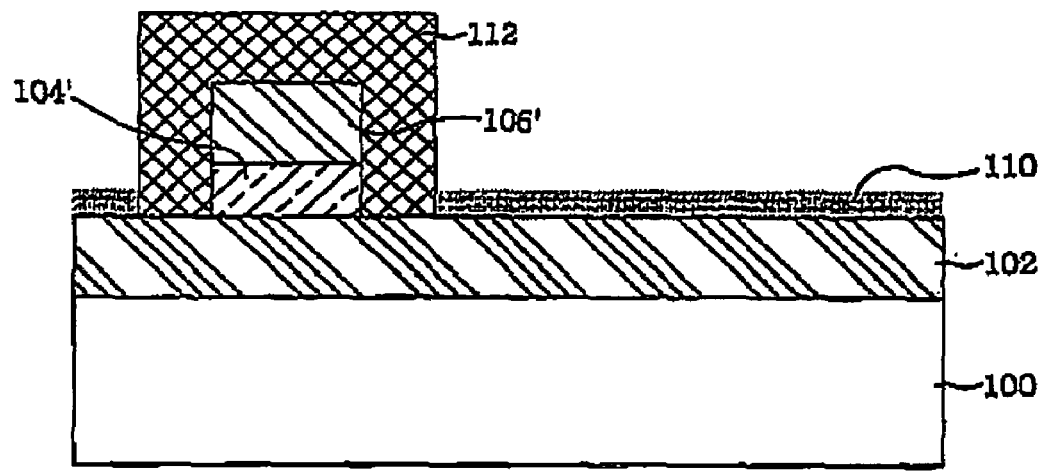

Next, as shown in FIG. 1C, the second photoresist pattern 112 for completely protecting the lower electrode film 106' and the capacitor insulating film 104' and patterning the lower metal layer 102 is formed on the structure produced by the third phase.

Figure 1D:
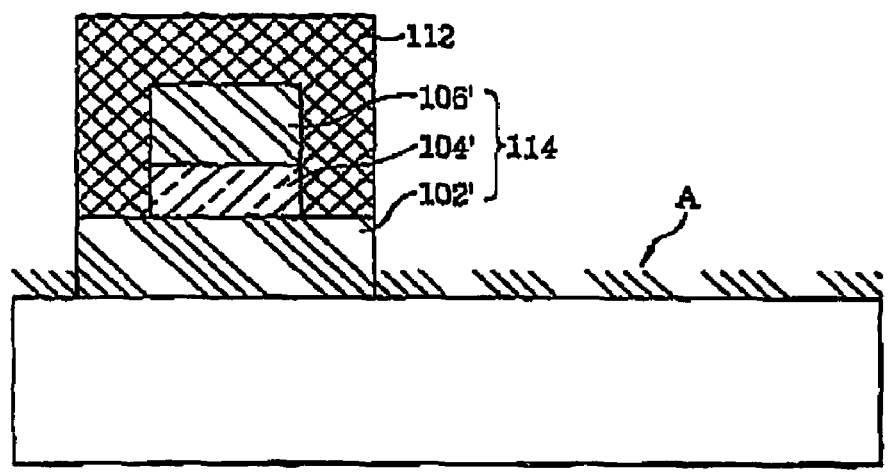

As shown in FIG. 1D, a lower electrode film 102' is formed by etching the lower metal layer 102 by using the second photoresist pattern 112 as a mask, and then a MIM capacitor 114 having the lower electrode film 102', the capacitor insulating film 104' and the upper electrode film 106' is produced by removing the second photoresist pattern 112 (block S212).

As mentioned above, a stability in subsequent processes is enhanced by removing polymer generated at the time of forming the upper electrode film and the capacitor insulating film, wherein the polymer is removed by a three-phase plasma processes. Moreover, characteristics of the semiconductor device are improved. As disclosed herein, a process margin for etching the lower metal layer can be secured by way of removing the polymer generated at the time of forming the upper electrode film and the capacitor insulating film, the polymer being removed by the ashing process made of a three-phase plasma processes.

According to one example method, a method for removing polymer generated in a semiconductor manufacturing process is disclosed. In one example, a disclosed method may include sequentially depositing a lower metal layer, an insulating layer and an upper layer on a semiconductor substrate; forming a photoresist pattern on the upper metal layer; and etching the upper metal layer and the insulating layer by using the photoresist pattern as a mask, the polymer being generated during the etching. The example method may also include: (a) removing the photoresist pattern by using $O_2/N_2$ plasma; and (b) removing the polymer existing on the lower metal layer by using $H_2O/CF_4$ plasma.

According to another example, a method may include (a) sequentially depositing a lower metal layer, an insulating layer and an upper metal layer on a semiconductor substrate; (b) forming a first photoresist pattern on the upper metal layer; (c) forming an upper electrode film and a capacitor insulating film by etching the upper metal layer and the insulating layer by using the first photoresist pattern as a mask; (d) removing the first photoresist pattern by using $O_2/N_2$ plasma; (e) removing polymer existing on the lower metal layer by using $H_2O/CF_4$ plasma; (f) forming a second photoresist pattern for completely encapsulating the upper electrode film and the capacitor insulating film; (g) forming a lower electrode film by etching the lower metal layer by using the second photoresist pattern as a mask; and (h) removing the second photoresist pattern to provide the capacitor including the lower electrode film, the capacitor insulating film and the upper electrode film.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of removing polymer generated in a semiconductor manufacturing process, which includes sequentially depositing a lower metal layer, an insulating layer and an upper layer on a semiconductor substrate; forming a photoresist pattern on the upper metal layer; and etching the upper metal layer and the insulating layer by using the photoresist pattern as a mask, the polymer being generated during the etching step, the method comprising:

(a) removing the photoresist pattern by using $O_2/N_2$ plasma;
   (b) removing the polymer existing on the lower metal layer by using $H_2O/CF_4$ plasma; and
   (c) using a plasma from a gas consisting essentially of $O_2$, removing residues of the photoresist pattern remaining after (b).

2. A method as defined by claim 1, wherein (a) is carried out for about 50 seconds.

3. A method as defined by claim 1, wherein a flow rate of a $CF_4$ gas in (b) is in a range from 5% to 15% of that of a $H_2O$ gas.

4. A method as defined by claim 1, wherein powers used in the (a), (b) and (c) are substantially same.

5. A method as defined by claim 1, wherein a process time of (c) is in a range from 40% to 60% of that of (a).

6. A method as defined by claim 1, wherein a process time of (b) is in a range from 30% to 50% of that of (a).

7. A method of manufacturing a semiconductor device having a capacitor, the method comprising:

(a) sequentially depositing a lower metal layer, an insulating layer and an upper metal layer on a semiconductor substrate;
   (b) forming a first photoresist pattern on the upper metal layer;
   (c) forming an upper electrode film and a capacitor insulating film by etching the upper metal layer and the insulating layer by using the first photoresist pattern as a mask;
   (d) removing the first photoresist pattern by using $O_2/N_2$ plasma;
   (e) removing polymer existing on the lower metal layer by using $H_2O/CF_4$ plasma, then removing remaining residues of the first photoresist pattern using a plasma from a gas consisting essentially of $O_2$;
   (f) forming a second photoresist pattern for completely encapsulating the upper electrode film and the capacitor insulating film;

(g) forming a lower electrode film by etching the lower metal layer by using the second photoresist pattern as a mask; and (h) removing the second photoresist pattern to provide the capacitor including the lower electrode film, the capacitor insulating film and the upper electrode film.

8. A method of removing polymer from a lower metal layer having an insulating layer and an upper metal layer thereon, the lower metal layer on a semiconductor substrate, the upper metal layer having a first photoresist pattern thereon, the method comprising steps of:

(a) removing the first photoresist pattern by ashing with a first plasma from a first gas mixture consisting essentially of $O_2$ and $N_2$;

(b) removing the polymer on the lower metal layer by ashing with a second plasma from a second gas mixture consisting essentially of $H_2O$ and $CF_4$; and (c) removing remaining residues of the first photoresist pattern with a third plasma from a gas consisting essentially of $O_2$.

9. A method as defined by claim 8, wherein step (a) is carried out for about 50 seconds.

10. A method as defined by claim 8, wherein step (b) comprises flowing $CF_4$ gas at a rate of from 5% to 15% of that of $H_2O$ gas.

11. A method as defined by claim 8, wherein steps (a), (b) and (c) each use substantially the same power.

12. A method as defined by claim 8, wherein a process time of step (c) is from 40% to 60% of that of step (a).

13. A method as defined by claim 8, wherein a process time of step (b) is from 30% to 50% of that of step (a).

14. The method of claim 8, further comprising, prior to step (a), steps of sequentially depositing the lower metal layer, the insulating layer and the upper metal layer on the semiconductor substrate; forming the first photoresist pattern on the upper metal layer; and forming an upper electrode by etching the upper metal layer using the first photoresist pattern as a mask.

15. The method of claim 14, further comprising, after forming the upper electrode and prior to step (a), forming a capacitor insulating film by etching the insulating layer using the first photoresist pattern as a mask.

16. The method of claim 15, further comprising, after step (b), steps of forming a second photoresist pattern completely encapsulating the upper electrode and the capacitor insulating film; forming a lower electrode by etching the lower metal layer using the second photoresist pattern as a mask; and removing the second photoresist pattern to provide a capacitor including the lower electrode film, the capacitor insulating film and the upper electrode film.

17. A method as defined by claim 1, wherein the $O_2/N_2$ plasma is formed from a gas mixture consisting essentially of $O_2$ and $N_2$.

18. A method as defined by claim 17, wherein removing the photoresist pattern is performed before removing the polymer existing on the lower metal layer.

19. A method as defined by claim 8, wherein the $O_2/N_2$ plasma is formed from a gas mixture consisting essentially of $O_2$ and $N_2$.

20. A method as defined by claim 19, wherein removing the photoresist pattern is performed before removing the polymer existing on the lower metal layer.

21. A method as defined by claim 8, wherein removing the first photoresist pattern is performed before removing the polymer on the lower metal layer.

\* \* \* \* \*